United States Patent
Kister et al.

(12)

(10) Patent No.: US 11,054,443 B2
(45) Date of Patent: Jul. 6, 2021

(54) PROBE TIP WITH EMBEDDED SKATE

(71) Applicant: FormFactor, Inc., Livermore, CA (US)

(72) Inventors: January Kister, Portola Valley, CA (US); Chun-Chih Wang, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/362,239

(22) Filed: Mar. 22, 2019

(65) Prior Publication Data

US 2019/0293685 A1 Sep. 26, 2019

Related U.S. Application Data

(60) Provisional application No. 62/646,840, filed on Mar. 22, 2018.

(51) Int. Cl.
*G01R 1/067* (2006.01)
*G01R 3/00* (2006.01)

(52) U.S. Cl.
CPC .......... *G01R 1/06761* (2013.01); *G01R 3/00* (2013.01)

(58) Field of Classification Search
CPC .. G01R 3/00; G01R 1/06722; G01R 1/06761; G01R 1/07342; G01R 1/07371; G01R 1/07378; H01L 41/47
See application file for complete search history.

(56) References Cited

U.S. PATENT DOCUMENTS

| 3,445,770 | A | 5/1969 | Harmon | |
|---|---|---|---|---|
| 5,977,783 | A | 11/1999 | Takayama | |
| 7,276,923 | B2 | 10/2007 | Takemoto | |
| 7,733,101 | B2 | 6/2010 | Kister | |
| 2002/0008530 | A1* | 1/2002 | Kim | G01R 1/06727 324/755.07 |
| 2004/0119485 | A1* | 6/2004 | Koch | G01R 3/00 324/755.07 |
| 2010/0182031 | A1 | 7/2010 | Kister | |
| 2010/0289512 | A1* | 11/2010 | Kister | G01R 3/00 324/750.16 |
| 2012/0112779 | A1 | 5/2012 | Smith | |
| 2017/0146569 | A1* | 5/2017 | Shimizu | G01R 31/2601 |

* cited by examiner

*Primary Examiner* — Son T Le
*Assistant Examiner* — Adam S Clarke
(74) *Attorney, Agent, or Firm* — Lumen Patent Firm

(57) ABSTRACT

A skate on a tip of a probe for testing electrical devices is a reduced thickness probe tip contact. Such a skate can advantageously increase contact pressure, but it can also undesirably reduce probe lifetime due to rapid mechanical wear of the skate. Here multilayer skate probes are provided where the overall shape of the probe tip is a smooth curved surface, as opposed to the conventional fin-like skate configuration. The skate layer is the most mechanically wear-resistant layer in the structure, so abrasive processing of the probe tip leads to a probe skate defined by the skate layer. The resulting probes provide the advantage of increased contact pressure without the disadvantage of reduced lifetime.

15 Claims, 9 Drawing Sheets

PROBE TIP WITH EMBEDDED SKATE

CROSS REFERENCE TO RELATED APPLICATIONS

This application claims the benefit of U.S. provisional patent application 62/646,840, filed on Mar. 22, 2018, and hereby incorporated by reference in its entirety.

FIELD OF THE INVENTION

This invention relates to probes for testing electrical integrated circuits.

BACKGROUND

Electrical probes have been employed for testing integrated circuits for many years. As a result of this ongoing development, many kinds of probe configurations have been considered. One such configuration is multilayer probes as in U.S. Pat. No. 7,733,101, and as shown on FIGS. 1A-D, where a multilayer probe includes one or more skate layers that extend past other layers at the probe tip. An advantage of this approach is that the thin skate layer gives rise to a higher contact pressure than would be obtained from a probe without a skate.

SUMMARY

However, there are aspects of multilayer skate probes that do not appear to be appreciated in the prior art. In operation, a probe tip is subject to mechanical wear both from periodic cleaning processes as well as from probing devices under test. A conventional multilayer skate probe will reach end of life when the skate has worn off, which may result in an undesirably short life span. Accordingly it would be an advance in the art to provide multilayer skate probes having improved life time.

In this work, we provide new multilayer probe designs where the overall shape of the probe tip is a smooth curved surface, as opposed to the conventional fin-like skate configuration. The skate layer forms the peak of that smooth curved surface as a result of abrasive cleaning of the probe in operation (and perhaps an abrasive pre-treatment before first operation to form the tip shape), provided that the skate layer is the most mechanically wear-resistant of all the layers in the probe. Here the skate can be effectively re-formed by the cleaning process, so the end of the probe life would be when too much material in total has been abraded from the probe tip. This can greatly increase probe lifetime relative to conventional multilayer skate probes.

It is important to note that probe life for conventional skate probes cannot be increased simply by increasing the vertical height of the skate. The probe skate layer is typically too thin to permit this approach. In this work, the vertical height of the skate layer can effectively be increased by sandwiching it between other layers of the probe tip to provide sufficient mechanical support. The ability to re-form the skate at the probe tip as needed with simple abrasive processing is an important aspect of this work.

In a preferred embodiment, the probe tip has a five-layer structure with layers 1-2-3-4-5. Layer 3 is the central skate layer, layers 2 and 4 are good electrical conductors (e.g., copper) and outer layers 1 and 5 provide mechanical support. An embodiment that allows further increase in the tip pressure, and thus desirable decrease of the electrical contact resistance, is a skate with small cross section, rectangular or square. Such skate would be encapsulated by the mechanical support layers on all 4 sides to prevent the skate from breaking. The position of the skate, the dimensions and the composition of the supporting and encapsulating layers can be tuned to achieve desirable contacting tip shape and location, as in the examples below.

DETAILED DESCRIPTION

Figure 1A:
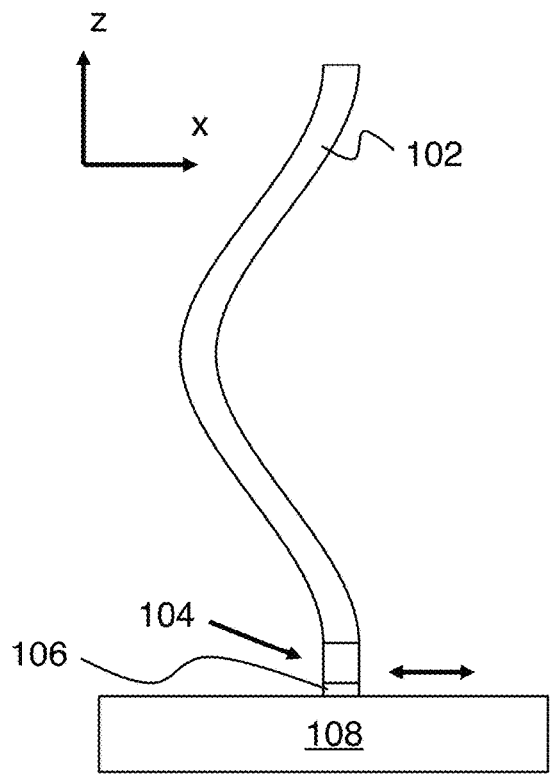
FIGS. 1A-D show exemplary prior art multilayer skate probes.
Figure 1B:
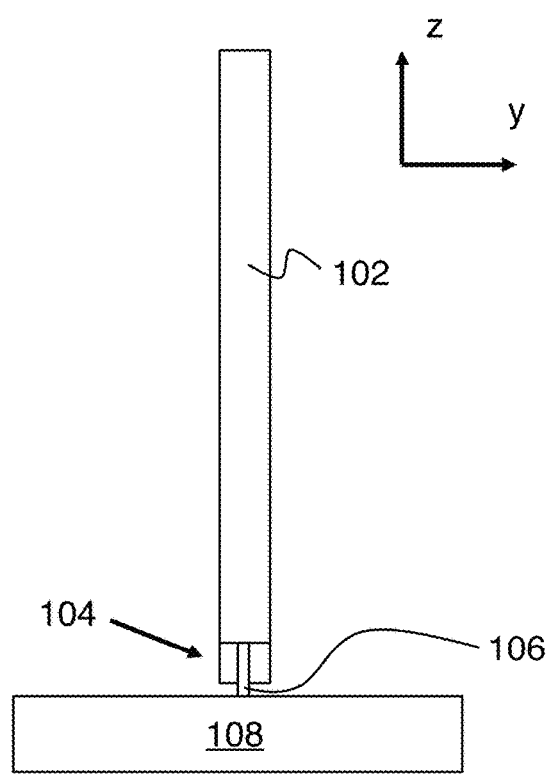
Figure 1C:
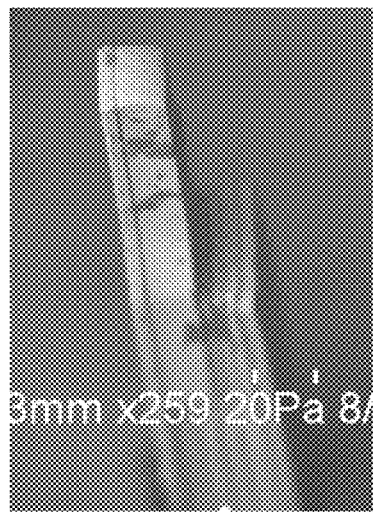
Figure 1D:
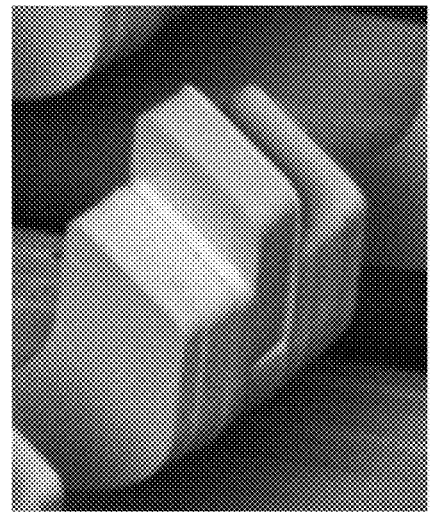

FIGS. 1A-D show exemplary prior art multilayer skate probes. Here FIGS. 1A-B are two orthogonal side views of a vertical probe 102 making contact to a device under test 108. Tip 104 of probe 102 is a multilayer structure with one layer 106 extending further than the others to form a skate as described above. On FIG. 1A, probe tip 104 will move in the direction shown by the double arrows when contacting device under test 108, and this scrubbing motion of the probe tip is an important source of probe tip wear in operation. FIGS. 1C-D show exemplary images of such known multilayer skate probes.

Figure 2A:
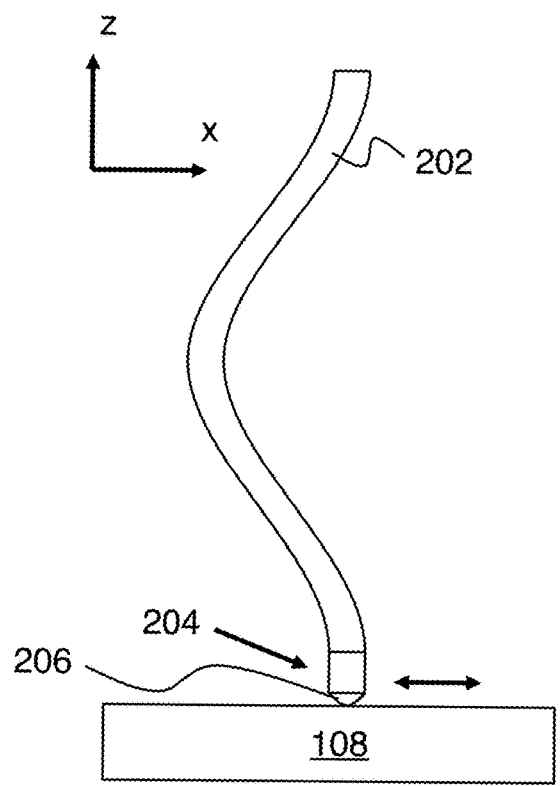
FIGS. 2A-B show a multilayer skate probe according to an embodiment of the invention.
Figure 2B:
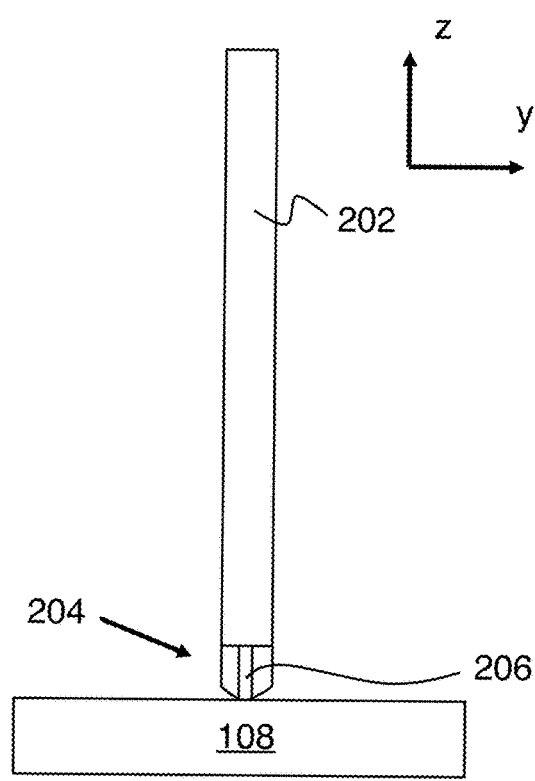

FIGS. 2A-B show a multilayer skate probe according to an embodiment of the invention. FIGS. 2A-B are two orthogonal side views of a vertical probe 202 making contact to a device under test 108. Tip 204 of probe 102 is a multilayer structure with one layer 206 extending further than the others to form a skate. On FIG. 2A, probe tip 204 will move in the direction shown by the double arrows when contacting device under test 108, and this scrubbing motion of the probe tip is an important source of probe tip wear in operation. However, here the contact region of the probe tip is formed by a smooth curved surface of the probe tip, as shown.

Accordingly, an exemplary embodiment of the invention is a probe for electrically contacting a device under test, where the probe includes a probe tip having a stack of two or more layers. The contact region of the probe tip is formed by a smooth curved surface of the probe tip. Part or all of a selected layer of the stack of two or more layers has the greatest mechanical wear resistance of the stack of two or more layers, and a distal peak of the smooth curved surface of the probe tip is formed by the selected layer, as shown. The distal end of a probe is the end of the probe that makes contact to the device under test. For probes having smooth curved surfaces at their tips, the distal peak of that smooth surface is the part of the probe that first makes contact with the device under test in operation. Preferably, as shown on FIG. 2A, a plane of the two or more layers is parallel to a direction of probe tip motion when probing devices under test. Further details on probe tip shape are provided by the following examples.

Here it is important to note that "smooth, curved surface" refers to the shape of the probe tip, with "smooth" denoting that this shape does not have discontinuities or edges in it. It specifically does not mean that the probe tip has a polished or mirror-like surface. Instead it is important for the probe tip to have a rough finish at a microscopic scale in order to effectively make electrical contact to the device under test. Abrasive processes as described herein can provide suitably rough surface finishes for the probe tip.

Figure 3A:
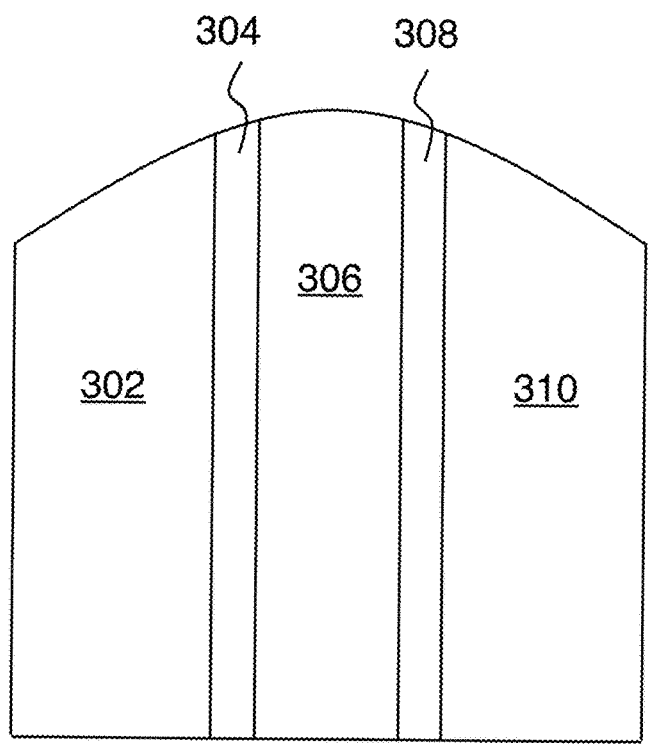
FIGS. 3A-B show a multilayer skate probe according to another embodiment of the invention.
Figure 3B:
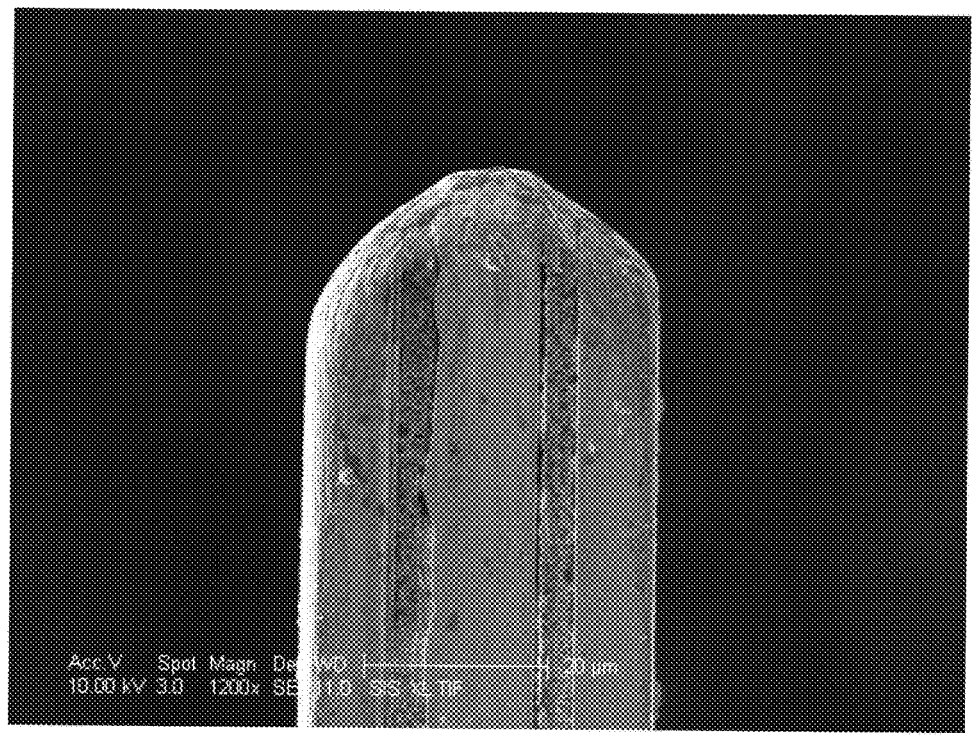

FIGS. 3A-B show a multilayer skate probe according to another embodiment of the invention. FIG. 3A is a side view of an exemplary multilayer stack. Here the probe tip includes layers 302, 304, 306, 308, 310. Preferably this stack of layers has an A-B-C-B-A configuration with A (layers 302, 310), B (layers 304, 308), C (layer 306) being distinct material compositions. Preferred relative material properties of A, B, C are as follows: A has higher mechanical strength (i.e., yield and ultimate strength) than B or C; B has higher electrical conductivity than A or C; and C has higher mechanical wear resistance (i.e. higher hardness) than A or B. FIG. 3B is an image of a fabricated probe tip having this structure. In the example of FIG. 3B, A is a PdCo alloy, B is Cu, and C is Rh. However other materials can be used as dictated by overall probe design, provided at least one of the layers has clearly higher mechanical wear resistance to form the skate. Alternatives for A include but are not limited to NiCo alloys. Alternatives for B include but are not limited to: Al alloys. Alternatives for C include but are not limited to: Ru and W.

Figure 4A:
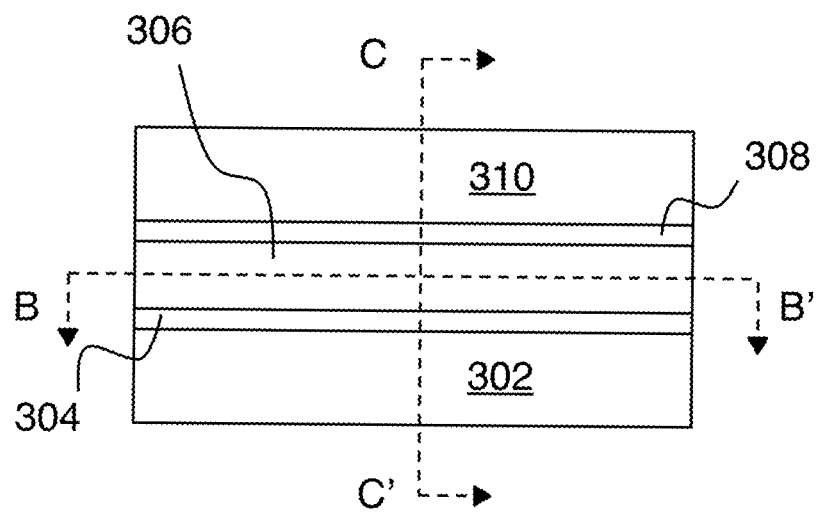
FIGS. 4A-C show a first example of probe tip shape according to principles of this work.
Figure 4B:
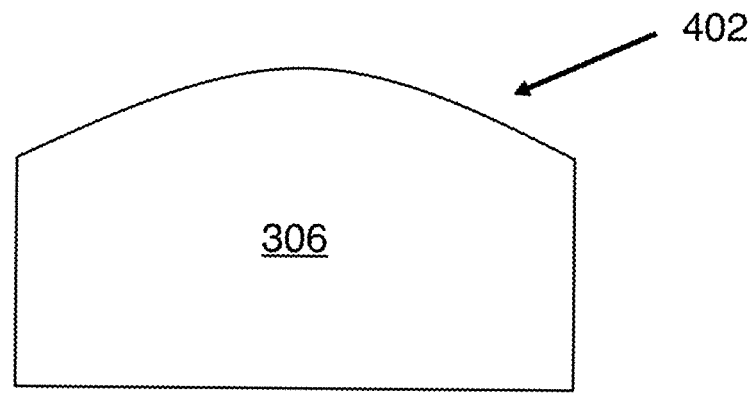
Figure 4C:
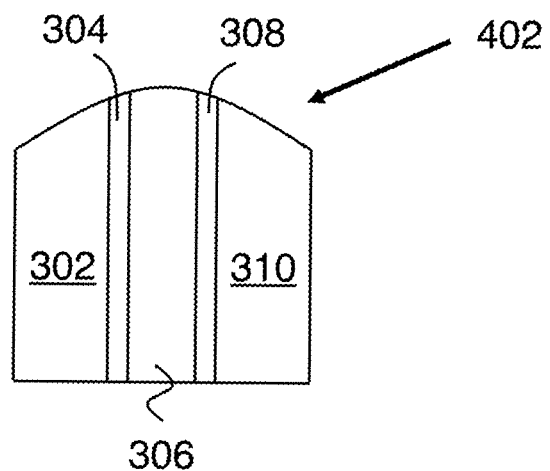

FIGS. 4A-C show a first example of probe tip shape according to principles of this work. Here FIG. 4A is an end view of the probe tip, FIG. 4B is a side view of the probe tip along section line B-B', and FIG. 4C is a side view along section line C-C'. As can be seen in FIGS. 4B and C, the smooth curved surface 402 of the probe tip is rounded in both lateral directions. Such probe tip shapes can be fabricated using abrasive processes as described below, and will form a peak as shown provided layer 306 has the highest mechanical wear resistance in the probe tip.

Figure 5A:
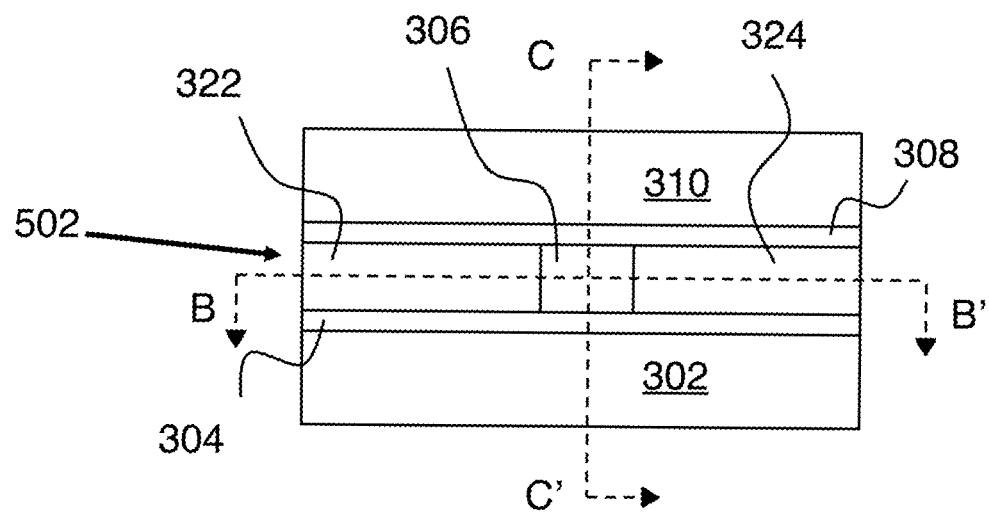
FIGS. 5A-C show a second example of probe tip shape according to principles of this work.
Figure 5B:
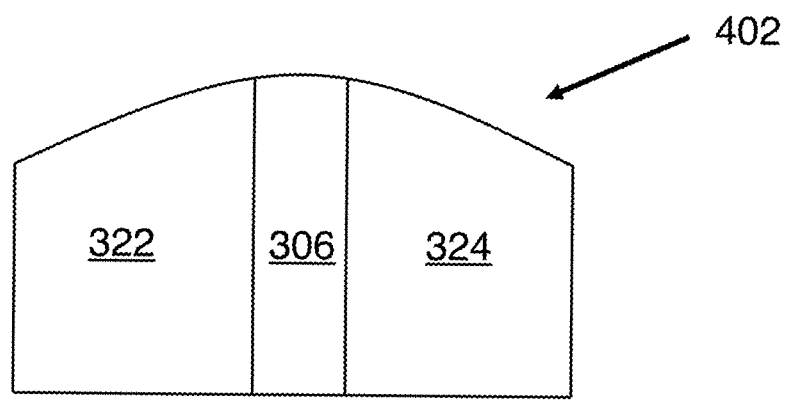
Figure 5C:
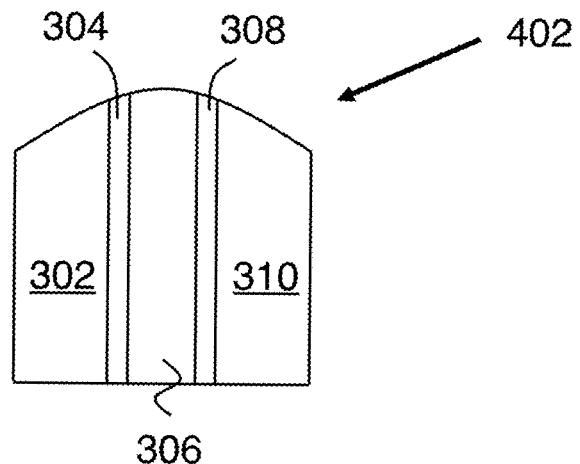

FIGS. 5A-C show a second example of probe tip shape according to principles of this work. Here FIG. 5A is an end view of the probe tip, FIG. 5B is a side view of the probe tip along section line B-B', and FIG. 5C is a side view along section line C-C'. This example differs from the example of FIGS. 4A-C by having selected layer 502 of the multilayer stack being itself a multi-region structure stacked in a direction perpendicular to a stacking direction of the stack of two or more layers. Here the regions are 322, 306, 324, with region 306 having the highest mechanical wear resistance and regions 322, 324 providing mechanical support. Preferably, as shown, the selected region of the multi-region structure is a middle region of the multi-region structure sandwiched between other regions that provide mechanical support.

Figure 6A:
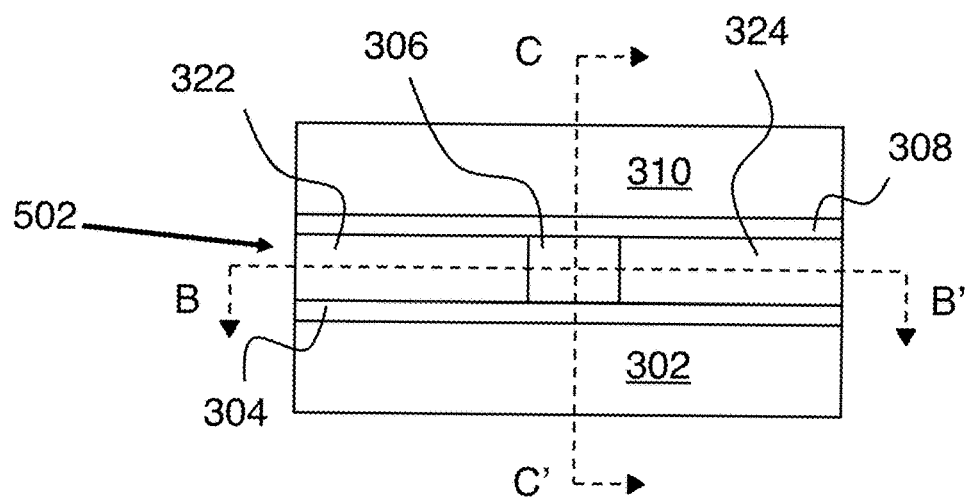
FIGS. 6A-C show a third example of probe tip shape according to principles of this work.
Figure 6B:
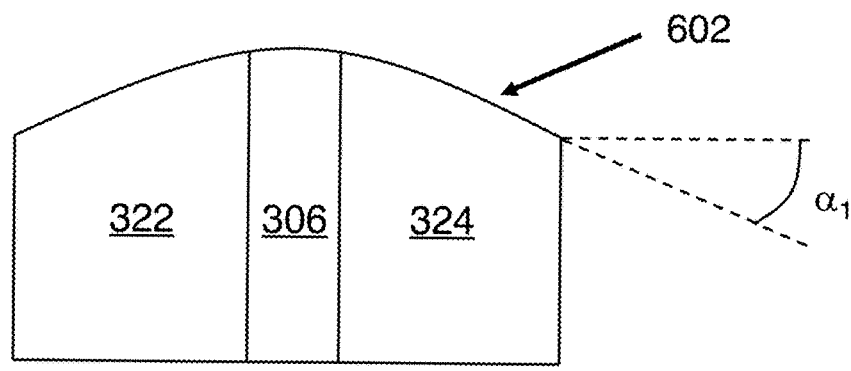
Figure 6C:
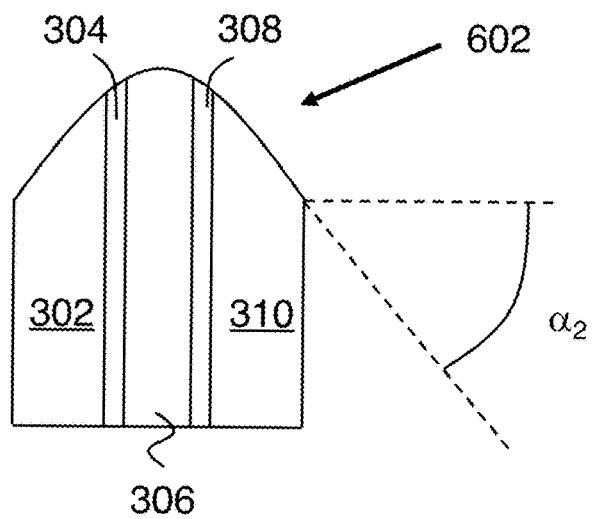

Details of the resulting probe tip shapes can be determined by adjusting material compositions in the tip structure and/or by adjusting detailed parameters of the abrasive processes described below. FIGS. 6A-C show an example of such a probe tip variation. This is similar to the example of FIGS. 5A-C except that material compositions and/or abrasive processes are tuned such that angles $\alpha_1$ and $\alpha_2$ of smooth curved surface 602 are markedly different in the two lateral directions, as shown.

Figure 7A:
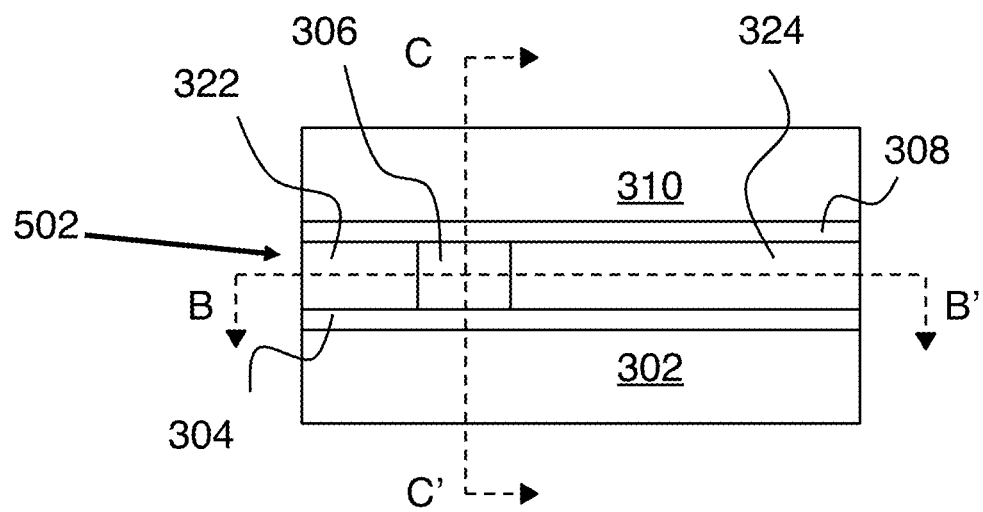
FIGS. 7A-C show a fourth example of probe tip shape according to principles of this work.
Figure 7B:
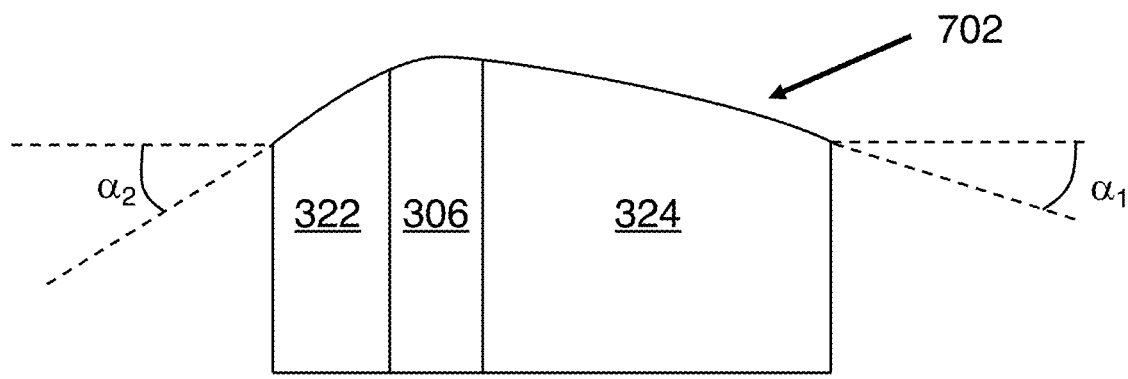
Figure 7C:
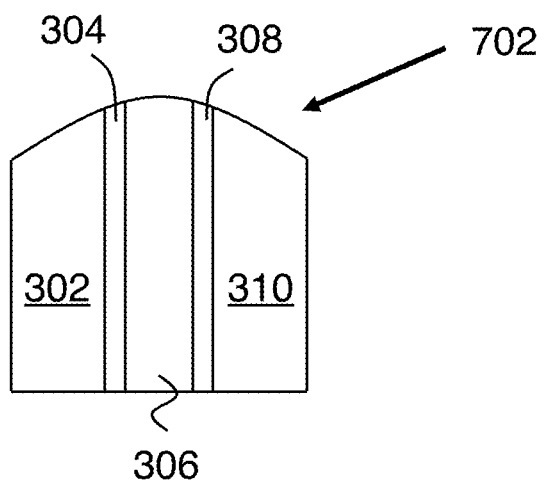

The region of highest mechanical wear resistance need not be laterally centered in the probe tip. FIGS. 7A-C show an example of such a probe tip variation. This is similar to the example of FIGS. 5A-C except that selected region 306 is off-center within selected layer 502. The resulting shape of smooth curved surface 702 is asymmetric along section B-B' (FIG. 7B) and symmetric along section C-C' (FIG. 7C).

Figure 8A:
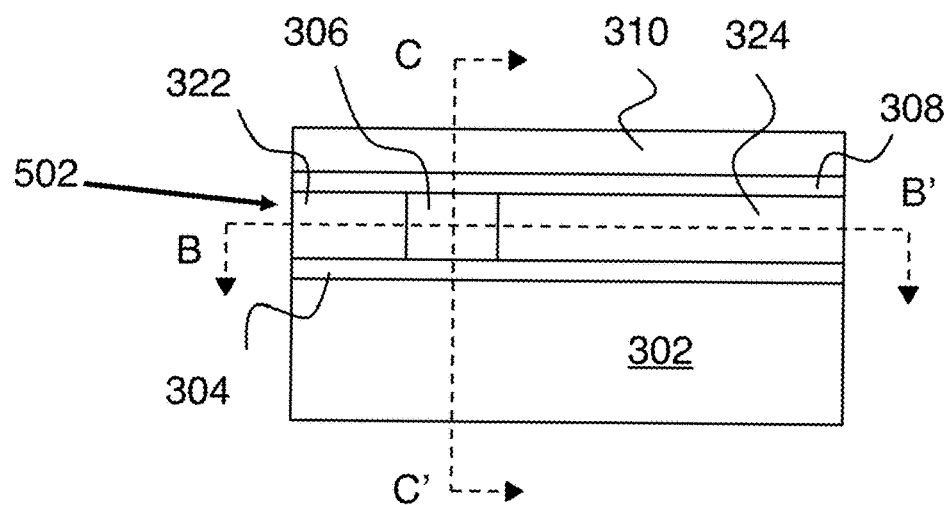
FIGS. 8A-C show a fifth example of probe tip shape according to principles of this work.
Figure 8B:
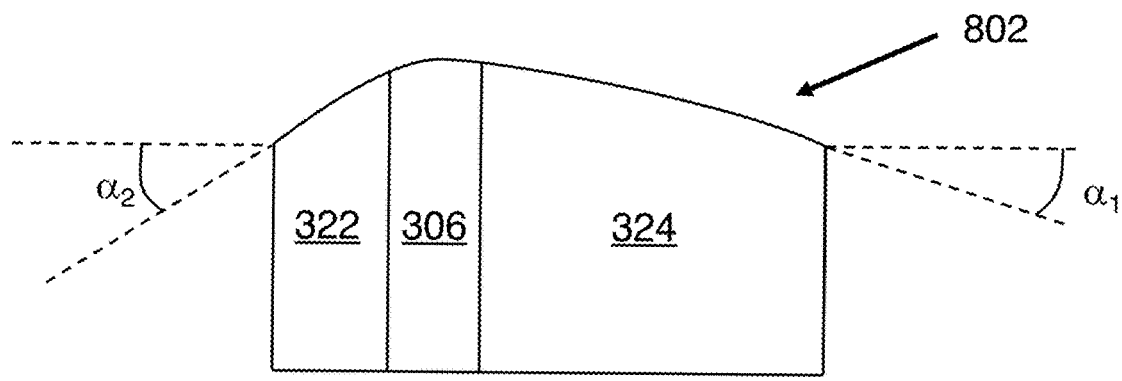
Figure 8C:
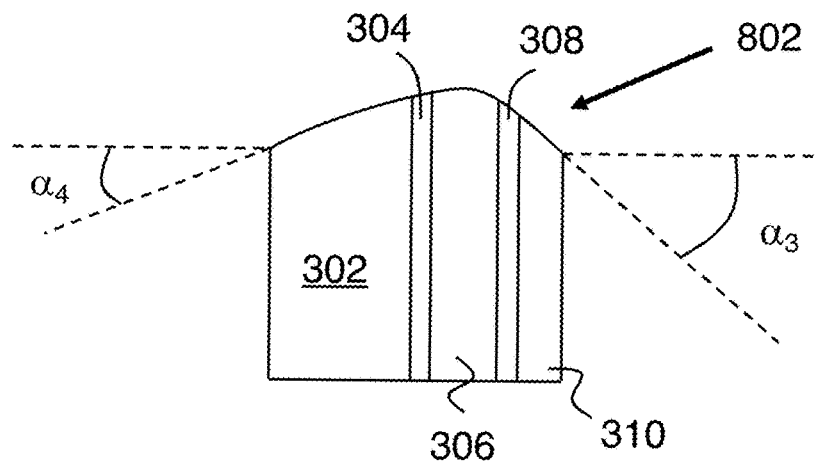

FIGS. 8A-C show another example of such a probe tip variation. This is similar to the example of FIGS. 5A-C except that selected region 306 is off-center within selected layer 502, and selected layer 502 is off-center within the layer stack 302-304-502-308-310. The resulting shape of smooth curved surface 802 is asymmetric along section B-B' (FIG. 8B) and asymmetric along section C-C' (FIG. 8C). Any other smooth curved probe tip surface shape can be used to practice the invention, as long as one or more layers or regions of the probe tip have clearly higher mechanical wear resistance than the rest of the probe tip, preferably such that abrasive processing of the probe tip forms well-defined skates.

Figure 9A:
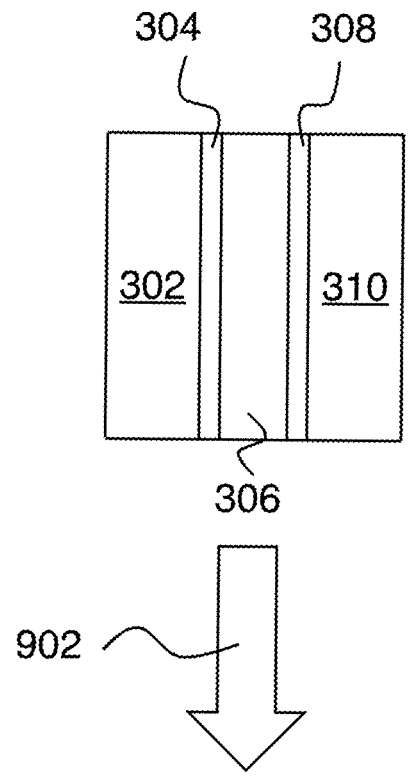
FIGS. 9A-B schematically show fabrication of a suitable probe tip shape via an abrasive process.
Figure 9B:
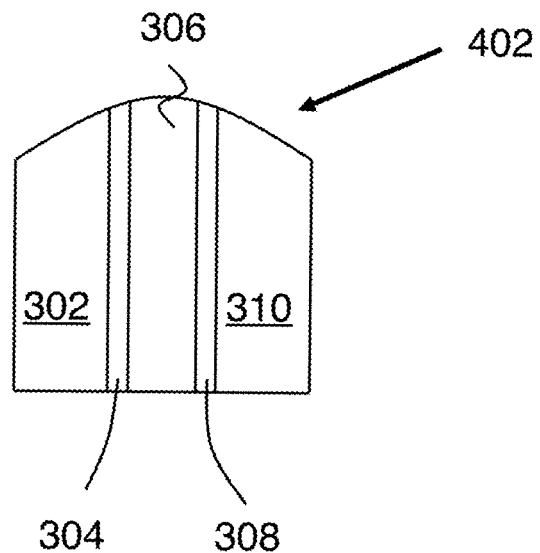

FIGS. 9A-B schematically show fabrication of a suitable probe tip shape via an abrasive process. The starting probe tip structure of FIG. 9A lacks a smooth curved probe tip surface as described above. An abrasive process 902 can provide a smooth curved probe tip surface 402 on FIG. 9B starting from the structure of FIG. 9A.

The abrasive process can include an initial tip-forming step. This will occur in situations where the probes as-fabricated in earlier steps have little or no probe tip curvature, and is the situation schematically shown on FIGS. 9A-B.

The abrasive process can also include tip wear from operation in device testing and/or from tip cleaning processes. Exemplary abrasive processes include contacting sandpaper with the probe tips (e.g., as if the sandpaper were a device under test). Another alternative here is to make contact with an abrasive elastic medium with the probe tips, again as if the abrasive medium were a device under test. Such tip forming processes are preferably done on an entire array of probes in one operation, as opposed to being done individually for each probe.

The invention claimed is:

1. A method of making a probe for electrically contacting a device under test, the method comprising: providing a probe having a probe tip, wherein the probe tip includes a stack of two or more layers; wherein a contact region of the probe tip is formed by a single smooth curved surface of the probe tip; wherein the single smooth curved surface of the probe tip includes at least two layers of the stack of two or more layers; wherein part or all of a selected layer of the stack of two or more layers has the greatest mechanical wear resistance of the stack of two or more layers; and wherein a distal peak of the single smooth curved surface of the probe tip is formed by the selected layer.

2. The method of claim 1, wherein the single smooth curved surface of the probe tip is made by abrading the probe tip with an abrasive process.

3. The method of claim 2, wherein the abrasive process comprises an initial tip-forming step.

4. The method of claim 2, wherein the abrasive process comprises tip wear from operation in device testing.

5. The method of claim 2, wherein the abrasive process comprises tip wear from tip cleaning processes.

6. The method of claim 2, wherein the abrasive process comprises contacting sandpaper with the probe tip.

7. The method of claim 2, wherein the abrasive process comprises contacting an abrasive elastic medium with the probe tip.

8. A probe for electrically contacting a device under test, the probe comprising:
- a probe tip, wherein the probe tip includes a stack of two or more layers;
- wherein a contact region of the probe tip is formed by a single smooth curved surface of the probe tip;
- wherein the single smooth curved surface of the probe tip includes at least two layers of the stack of two or more layers;
- wherein part or all of a selected layer of the stack of two or more layers has the greatest mechanical wear resistance of the stack of two or more layers; and
- wherein a distal peak of the single smooth curved surface of the probe tip is formed by the selected layer.

9. The probe of claim 8, wherein the stack of layers has an A-B-C-B-A configuration, wherein A, B, C are distinct material compositions, wherein A is a material composition having higher mechanical strength than B or C, wherein B is a material composition having higher electrical conductivity than A or C, and wherein C is a material composition having higher mechanical wear resistance than A or B.

10. The probe of claim 9, wherein A is selected from the group consisting of: PdCo alloys and NiCo alloys.

11. The probe of claim 9, wherein B is selected from the group consisting of: Al alloys and Cu.

12. The probe of claim 9, wherein C is selected from the group consisting of: Rh, Ru and W.

13. The probe of claim 8, wherein a plane of the two or more layers is parallel to a direction of probe tip motion when probing devices under test.

14. The probe of claim 8, wherein the selected layer is itself a multi-region structure stacked in a direction perpendicular to a stacking direction of the stack of two or more layers, and wherein a selected region of the multi-region structure has the greatest mechanical wear resistance of the multi-region structure.

15. The probe of claim 14, wherein the selected region of the multi-region structure is a central region of the multi-region structure.

* * * * *